United States Patent

Bailey et al.

[11] Patent Number: 5,916,378
[45] Date of Patent: Jun. 29, 1999

[54] METHOD OF REDUCING METAL CONTAMINATION DURING SEMICONDUCTOR PROCESSING IN A REACTOR HAVING METAL COMPONENTS

[75] Inventors: Robert Jeffrey Bailey, Santa Cruz; Patrick J. Brady, Livermore, both of Calif.

[73] Assignee: WJ Semiconductor Equipment Group, Inc., Scotts Valley, Calif.

[21] Appl. No.: 08/823,655

[22] Filed: Mar. 11, 1997

[51] Int. Cl.$^6$ ..................................................... C23C 22/00
[52] U.S. Cl. .......................... 148/243; 148/275; 148/276; 148/280; 148/285; 428/472.2; 438/379; 438/680; 438/681; 438/909
[58] Field of Search ...................... 148/243, 275, 148/276, 280, 285; 428/472.2; 438/379, 680, 681, 909

[56] References Cited

U.S. PATENT DOCUMENTS 4,929,287  5/1990  Hirbod ..................................... 148/276
5,294,586  3/1994  Sigler ....................................... 148/285

Primary Examiner—David A. Simmons
Assistant Examiner—Robert R. Koehler
Attorney, Agent, or Firm—Flehr Hohbach Test Albritton & Herbert LLP

[57] ABSTRACT

A method of reducing metal contamination during semiconductor processing in a reactor having metal components is provided. The method includes forming an aluminum oxide layer on the surface of certain of the metal components before processing of substrates. The aluminum oxide layer substantially prevents the formation of volatile metal atoms from the metal components. The aluminum oxide layer is formed by heating the metal component first in a dry $N_2$ atmosphere to a first temperature, and then in a dry $H_2$ atmosphere to a second temperature. The component is then soaked at the second temperature in a wet $H_2$ atmosphere to form the aluminum oxide layer, and is followed by soaking at the second temperature in a dry $H_2$ atmosphere to reduce any other metal oxides that may have formed. The component is then cooled first in a dry $H_2$ atmosphere, and then in a dry $N_2$ atmosphere where a layer of substantially pure aluminum oxide is provided on the surface of the metal component.

34 Claims, 4 Drawing Sheets

METHOD OF REDUCING METAL CONTAMINATION DURING SEMICONDUCTOR PROCESSING IN A REACTOR HAVING METAL COMPONENTS

The invention relates generally to the field of semiconductor processing and more specifically to a method of reducing metal contamination on the surface of a substrate and in a film grown during semiconductor processing in a reactor having metal components by forming a layer of aluminum oxide on the surface of the metal components.

BACKGROUND OF THE INVENTION

In the manufacture of semiconductors and integrated circuits, various films or layers of materials are deposited during the fabrication of such circuits. Dielectric films are widely deposited on semiconductor wafers to electrically isolate conductive layers and enable useful interconnects between such layers. Dielectric and other films, such as hydrides, are often formed by chemical vapor deposition (CVD). The CVD process deposits a material on a surface by transport and reaction of certain gaseous precursors on the surface. CVD reactors come in many forms. Low pressure CVD systems (LPCVD) and atmospheric pressure CVD systems (APCVD) operate on thermal CVD principles. Plasma may be employed to assist decomposition of chemicals for reaction in plasma enhanced CVD systems (PECVD).

Since CVD deposits the components of the precursor chemicals, it is important to minimize contaminants in the CVD reactor environment because such contaminants may become deposited in the film. Contaminants in the film damage the function of the devices on the wafer and reduce the device yields. Metal contamination is especially detrimental to dielectric layers formed on silicon wafers because the metal impurities will exhibit electrical properties after thermal processing thereby affecting gate oxides and other device features.

Contaminants can arise from many sources. In addition to the presence of impurities in the precursor chemicals, contaminants can arise from the CVD systems themselves. CVD processing apparatus are comprised of a variety of metal components and are a potential source of metal contamination. During semiconductor processing metal atom contaminants may arise from some of the metal components making up the processing equipment. Such contaminants may be delivered to the semiconductor substrates where they contaminate the substrate surfaces and/or deposit in the film. Accordingly, it is desirable to provide a method for reducing metal contamination from metal surfaces in semiconductor processing equipment and for depositing films with low metal contamination.

OBJECTS AND SUMMARY OF THE INVENTION

Accordingly, it is an object of the present invention to provide a method for reducing metal contamination in films formed on substrates during semiconductor processing.

Additionally, it is an object of the present invention to provide a method for reducing contamination on the surfaces of a substrate during semiconductor processing.

More particularly, it is an object of the present invention to provide a method adapted for minimizing the formation of metal contamination in semiconductor processing equipment.

It is a further object of the present invention to provide a method of reducing metal contamination by forming a layer of aluminum oxide ($Al_2O_3$) on the surface of the metal components in a semiconductor processing system.

Another object of the present invention is to provide a method of forming an aluminum oxide layer on the surface of metal components by heating in hydrogen and water vapor atmosphere, at various dewpoints.

These and other objects and advantages are achieved by the method of the invention disclosed herein of reducing metal contamination on the surfaces of a substrate and in a film formed on the substrate during processing in a reactor having metal components, comprising the steps of: forming an aluminum oxide layer on the surface of certain of the metal components before processing the substrate. The aluminum oxide layer formed on the metal surfaces substantially prevents the formation of volatile metal atoms occurring from the metal components during processing thereby minimizing metal atom contamination on the surfaces of the substrate and in the film deposited on the substrate.

The method of the present invention also provides for forming an aluminum oxide layer on the surface of metal components comprising the steps of heating the metal component first in a dry $N_2$ atmosphere to a first temperature, and then in a dry $H_2$ atmosphere to a second temperature; soaking the metal at the second temperature in a wet $H_2$ atmosphere having a dewpoint of in the range of approximately −40 to −20° C. to form an aluminum oxide layer on the surface of the metal; followed by soaking at the second temperature in a dry $H_2$ atmosphere to reduce any metal oxide, other than the aluminum oxide that may have formed. The metal is then cooled first in dry $H_2$ atmosphere to approximately at least 400° C. and then in a dry $N_2$ atmosphere to room temperature, wherein a layer of substantially pure aluminum oxide is provided on the surface of the metal. In an alternative embodiment, after the heating steps the metal component is soaked in a wet $H_2$ atmosphere having a dewpoint in the range of approximately −10° C. to 25° C. to form a thin Cr oxide layer on the surface of the metal, which is then reduced to provide the layer of substantially pure aluminum oxide on the surface of the metal.

BRIEF DESCRIPTION OF THE DRAWINGS

Other objects and advantages of the present invention become apparent upon reading of the detailed description of the invention provided below and upon reference to the drawings in which.

DETAILED DESCRIPTION OF THE INVENTION

Figure 1:
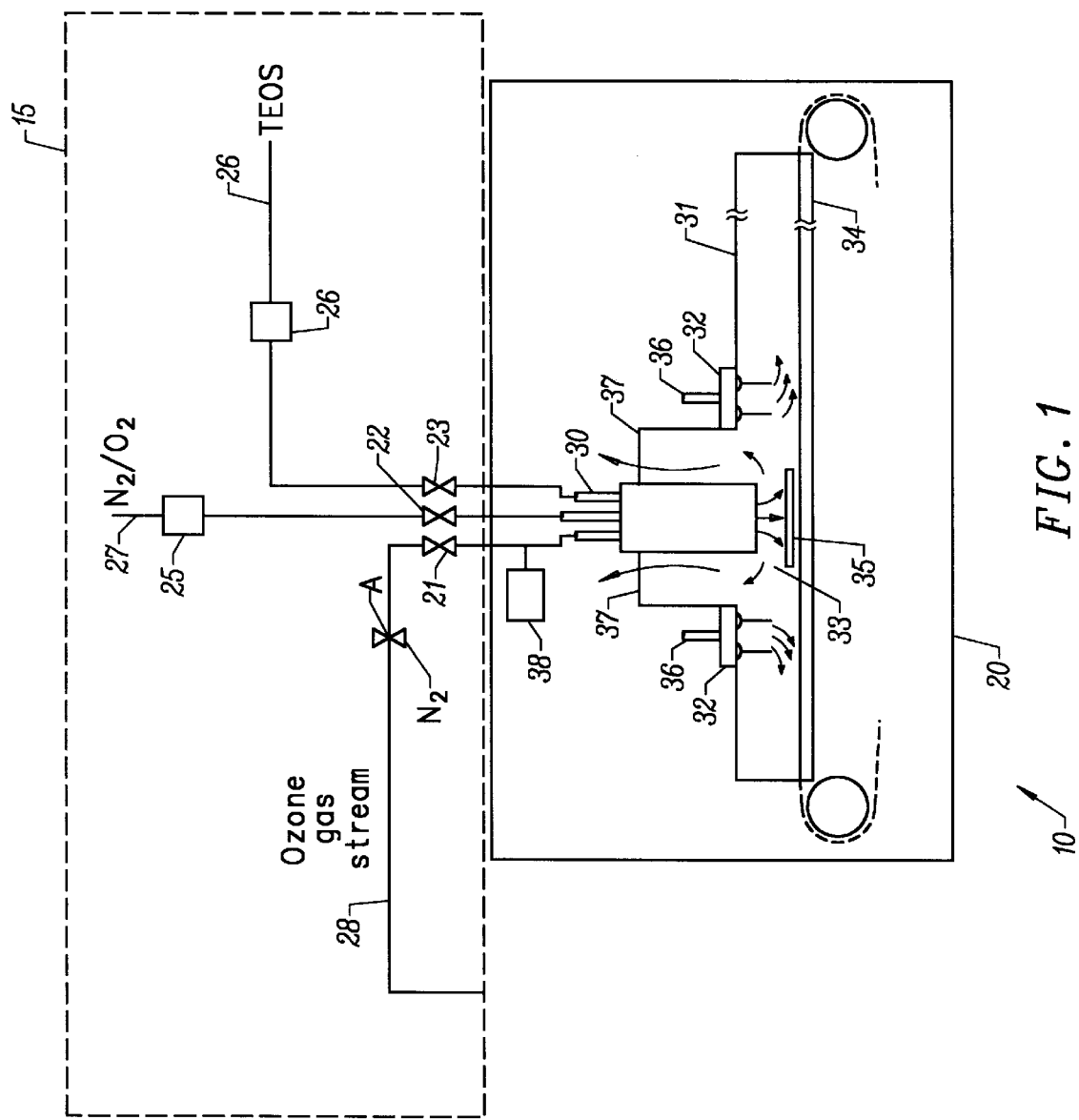
FIG. 1 is a partial schematic view, partially in cross-section, of a chemical vapor deposition (CVD) system apparatus which may be employed to practice the method of the present invention.

Turning to the drawings, wherein like components are designated by like reference numerals, FIG. I shows a schematic representation of an apparatus that can be employed to practice the method of the present invention.

FIG. 1 depicts a chemical vapor deposition (CVD) system 10 which generally includes a CVD reactor 20 and a gas delivery system 15 having conduits for delivery of gases to the reactor 20. CVD reactor 20 is shown as a conveyorized atmospheric pressure CVD (APCVD) type reactor, which is more fully descried in U.S. Pat. No. 4,834,020 and is herein incorporated by reference. It is important to note that although an APCVD reactor is shown, the inventive method may be practiced using other types of CVD reactors such as low pressure CVD (LPCVD) and plasma enhanced CVD (PECVD) reactors. The APCVD reactor 20 shown in FIG. 1 typically includes a muffle 31, a plurality of injectors 30 defining multiple stages (for simplicity only one injector 30, and thus one stage is shown) and a conveyor belt 34. Typically the reactor 20 comprises four stages, each of which are substantially identical. Within the muffle 31, a plurality of curtains 32 are placed around both sides of the injector 30 to isolate an area, and therebetween forming a deposition chamber area 33. The curtains 32 include a plurality of inert gas plenums 36 which cause inert gases to flow downwardly and along the belt 34, thereby aiding to isolate the deposition chamber area 33.

To deposit a film of material on the surface of a semiconductor device, a substrate 35 is placed on the conveyor belt 34 and is delivered into the muffle 31 and through the deposition chamber area 33. In the deposition chamber area 33, gaseous chemicals are conveyed by the injector 30 to the area proximate the surface of the substrate 35, wherein the gaseous chemicals react and deposit a film of material on the surface of the substrate 35.

The gaseous chemicals are delivered to the reactor 20 via gas delivery system 15, wherein said gaseous chemicals are individually conveyed to the injector 30 through gas delivery lines 26, 27 and 28. In an exemplary embodiment, the gases conveyed though gas delivery lines 26, 27 and 28 are: TEOS, a nitrogen/oxygen mixture (separator $N_2$), and an ozone/oxygen mixture, respectively. In this embodiment, the TEOS and ozone gases react to form a layer of silicon ($SiO_2$) on the surface of the substrate 35. As the gases react in the deposition chamber area 33, byproducts and unreacted chemicals are generally removed through exhaust lines 37 as shown by the general direction of the arrows.

In order to deposit layers of a desired composition and purity on the surface of the substrate 35, it is important to minimize the contaminants in the CVD system. The primary contaminant is metal atoms which may manifest in two ways; first by accumulating on the surfaces on the substrate exposed to metal surfaces in the CVD system, and second by depositing in the film formed on the substrate. The present invention promotes the reduction of contaminates on the surface of the substrate and the deposition of desired films by a method of reducing the presence of volatile atoms in the CVD reactor 20. The inventors have discovered that during processing certain volatile metal atoms are formed, particularly chromium atoms, which become present in the deposition chamber and deposit in the film formed on the wafer. Additionally, metal contaminates can accumulate on substrate surfaces in physical contact with metal components in the CVD system, such as the belt 34 and muffle 31.

To reduce such metal contamination, the inventive method employs an aluminum oxide layer on the surface of metal components within the CVD system 20 which are in close proximity to the substrate. However, the invention is not limited to these certain components, and all Ni- or Fe-based metal components containing aluminum in the system may be treated. Specifically, the belt 34 is a woven conveyor belt made from a metal alloy, typically Pyromet 601, and the muffle 31 is made of a metal alloy, typically Inconel 601. In prior art systems, the belt and muffle are typically installed with no attention paid to surface preparation other than cleaning to remove residual oils used during fabrication. These metal surfaces develop only a thin native oxide when they are first heated in the reactor 20. After many hours of exposure to depositions temperatures of up to 600° C., a thermal oxide comprised mainly of chromium oxide ($Cr_2O_3$) is formed on the belt 34 and the interior surface of the muffle 31. Although this oxide is largely responsible for the desirable self-limiting oxidation properties, the inventors have discovered that it may be a source of Chromium contamination in the film deposited on the surface of the wafers. Specifically, it is believed that volatile $CrO_2(OH)_2$ is formed from the $Cr_2O_3$ oxide in the heated deposition reactor when exposed to oxygen at high temperatures according to the reaction:

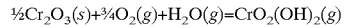

$$\tfrac{1}{2}Cr_2O_3(s)+\tfrac{3}{4}O_2(g)+H_2O(g)=CrO_2(OH)_2(g)$$

The volatile $CrO_2(OH)_2$ then condenses on the wafer surface. This is an endothermic reaction and thus the generation rate of $CrO_2(OH)_2$ is greatly increased with increasing temperature. The inventors have observed that the vapor Chromium contamination levels in silicon wafers increase with increasing temperature in the reactor 20.

To minimize the formation of volatile metal atoms, particularly Chromium, the method of the present invention provides for the formation of an aluminum oxide ($Al_2O_3$) on the surface of certain metal components within the deposition chamber. The inventors have found that $Al_2O_3$ does not form volatile oxides. The method of the present invention provides for preoxidation of metal components, and then employing the components with a substantially pure $Al_2O_3$ layer in the deposition chamber. While it has been reported in certain technical literature (i.e. H. M. Tawancy, N. Sridhar, Oxidation of Metals, 37, 143 1992; and H. M. Tawancy, Journal of Materials Science, 28, 561 1993) that a $Al_2O_3$ surface layer may form spontaneously in an air environment at high temperatures of equal to or greater the 1000° C. after up to 1000 hours at that temperature, the reactor 20 operates at temperatures substantially below this and thus an $Al_2O_3$ layer will not form spontaneously on metal components in the reactor 20. Further, the $Al_2O_3$ layer reported as forming spontaneously is a final oxide in a progression of Ni, Fe and Cr containing oxides. Accordingly, such a method would not minimize the formation of the damaging oxides.

In the preferred embodiment, the belt 34 and the muffle 31 are oxidized, however, any number of metal components may be subject to this treatment. To form the oxide layer, the present invention provides for a method of forming a highly pure $Al_2O_3$ layer on aluminum-containing Ni-based metal alloys in an appropriate atmosphere to yield the oxide layer with substantial uniformity on metal parts, including high surface area parts. Preferably, the metal alloy will contain approximately 3 to 5 weight percent aluminum.

The method of the present invention provides for oxidation of metal alloys at elevated temperature in the range of approximately 1000° C. to 1150° C., in a hydrogen atmosphere containing small amounts of $H_2O$. The $H_2$ ambient prevents oxidation of Ni and Fe present in the metal alloy. Adding $H_2O$ to the hydrogen ambient helps to prevent Cr oxidation, while allowing aluminum oxidation to occur.

Figure 2:
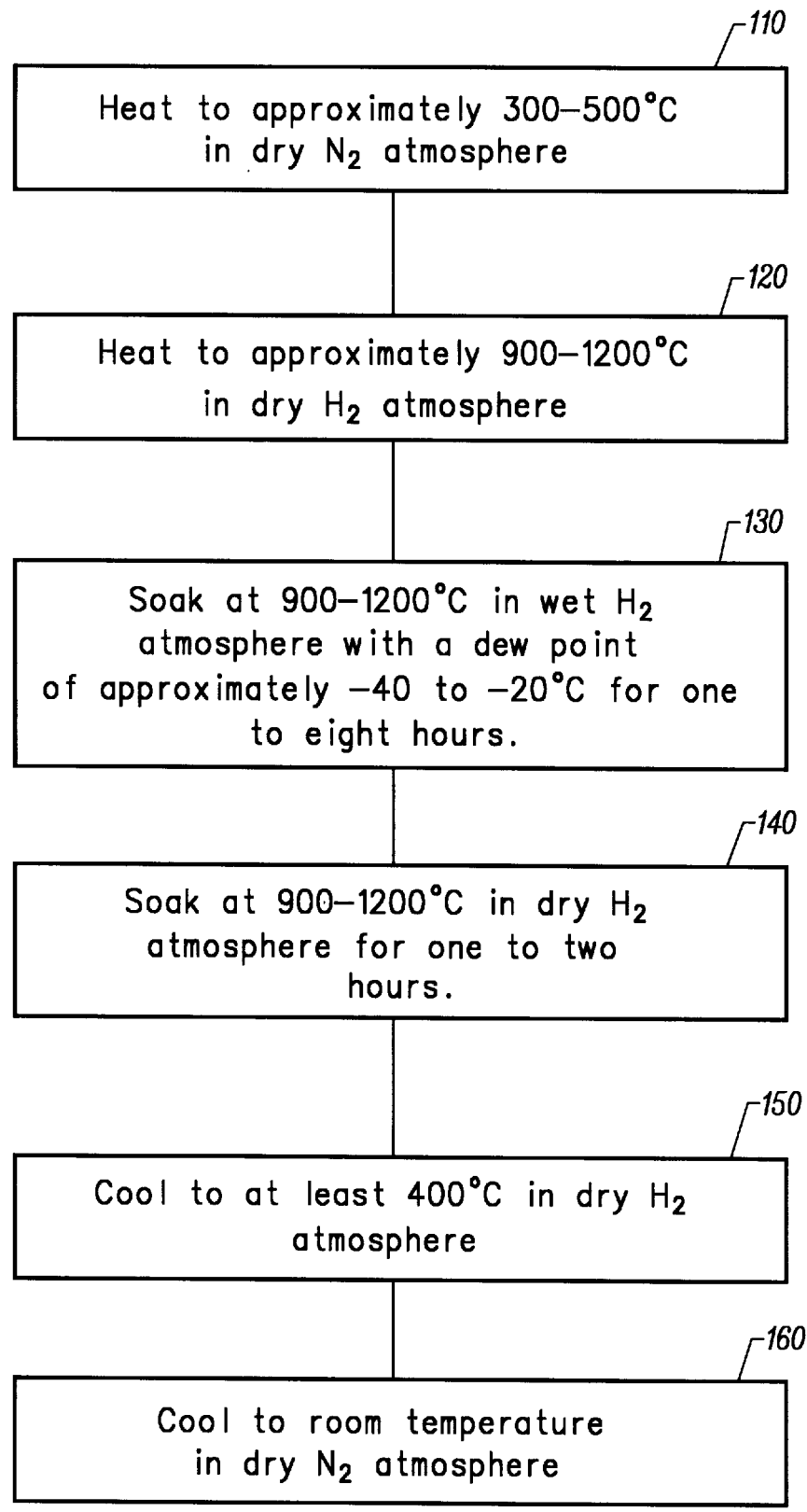
FIG. 2 is a flow chart of one embodiment of the method in accordance with the present invention.

One embodiment of the inventive method is shown in FIG. 2. The metal component to be oxidized is placed in a sealed retort and then heated to a first temperature in the range of about 300° C. to 500° C., preferably to 400° C., in a flowing dry N$_2$ atmosphere in the first step 110. Next, in step 120, the flowing gas is changed to dry H2 as the metal component is heated to a second temperature in the range of about 900° C. to 1200° C., preferably to 1100° C.. Dry H$_2$ is generally defined as a flowing H$_2$ gas with a dewpoint lower than about −50° C. The dry H$_2$ environment prevents nitride formation. In step 130 the metal component is soaked at the second temperature in a moist H$_2$ atmosphere with a dewpoint in the range of −40 to −20° C. for about 1 to 8 hours. Preferably, the dewpoint is −35° C. and the time of soaking is five hours. This step forms a layer of Al$_2$O$_3$ on the surface of the metal component. The metal component is then soaked at the second temperature in a dry H$_2$ atmosphere for about 1 to 2 hours in step 140. This step 140 reduces any metal oxide other than Aluminum which might have formed on the treated part or retort hardware. The metal component is then cooled in steps 150 and 160, first to about 400° C. in a dry H$_2$ atmosphere and then to room temperature in a dry N$_2$ atmosphere.

Figure 3:
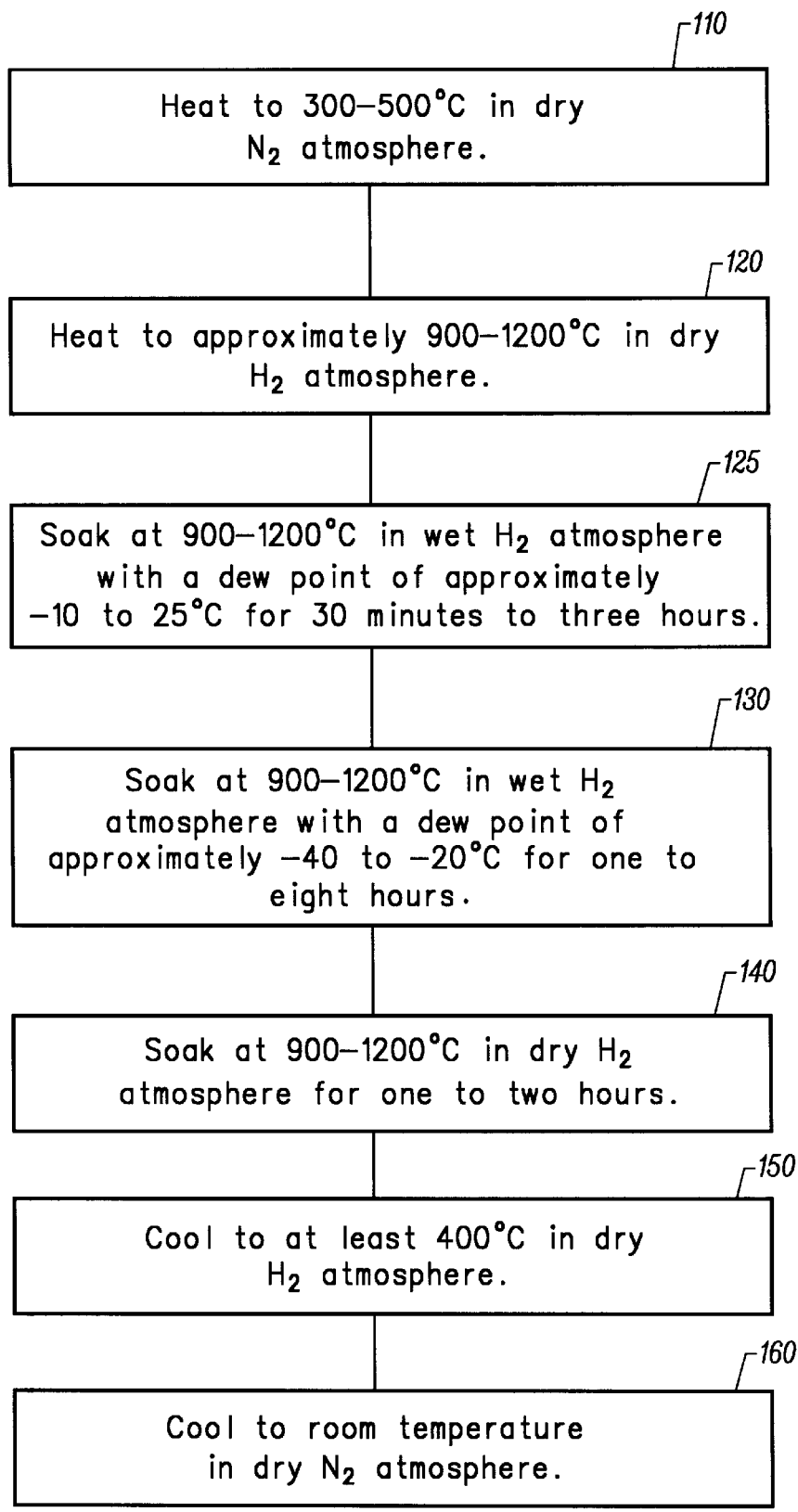
FIG. 3 is a flow chart of an alternative embodiment of the method in accordance with the present invention.

An alternative embodiment in shown in FIG. 3. In this embodiment, an additional method step is added to improve the final Aluminum oxide uniformity on the surfaces of the metal components. The additional step 125 occurs after heating to the second temperature in step 120, wherein the metal component is soaked at the second temperature in a wet H$_2$ atmosphere with a dewpoint of approximately −10° C. to 25° C. for about 30 minutes to 3 hours. Preferably, the dewpoint is −1 C and the time of soaking is ninety minutes. The other steps are the same as in FIG. 2. This step 125 forms a thin Cr$_2$O$_3$ layer on the surface of the metal. This step 125 is of particular advantage when oxidizing high surface area components such as the wire belt 34. The high surface area of such components significantly depletes the H$_2$ ambient gas of as it flows through the components, which locally reduces the dewpoint and causes nonuniform oxide to form. To minimize this occurrence, the H$_2$ atmosphere dewpoint is raised temporarily in step 125 which causes a thin, uniform layer of Cr$_2$O$_3$ to form. When the dewpoint is lowered in step 130, the Cr$_2$O$_3$ oxide layer acts as an oxygen source for the growing aluminum oxide layer. Thereafter, the chromium is fully reduced in steps 130 and 140 to the metallic state, leaving a substantially pure, uniform layer of Al$_2$O$_3$. Tests using the XPS analysis technique have demonstrated impurity levels in the final Al$_2$O$_3$ layer of less than 1 atomic percent for each of the constituents of Cr, Fe and Ni.

Prevention of chromium oxidation depends upon the dewpoint of the ambient hydrogen, and the dewpoint is a function of the oxidation temperature as shown in Table 1 below:

TABLE 1

| Oxidation Temperature (° C.) | Maximum H$_2$ Dewpoint (° C.) |
|---|---|
| 1000 | −25 |
| 1050 | −20 |
| 1100 | −15 |

It is important that the dewpoints be accurately controlled at or below the values reported in Table 1 in order to form a substantially pure layer of aluminum oxide. Oxidation times vary with oxidation temperature and the desired oxide thickness. At an oxidation temperature of 1100° C. the oxidation time, step 130, is generally in the range of 1 to 8 hours, and preferably is about 5 hours. It is important that the aluminum oxide layer formed be of a sufficient thickness. The thickness of the aluminum oxide layer will generally be in the range of 0.6 to 1.0 microns, and preferably is at least 0.8 micron thick. Experiments have shown that if the aluminum oxide formed is of a 0.8 microns thick, further heating in the range of 500° C. to 700° C. in the deposition reactor does not cause a significant change in the surface composition of the metal for at least several months. Thus, it is shown that the aluminum oxide layer is an effective barrier to inward diffusion of oxygen and outward diffusion of Cr, Ni and Fe constituents in the metal. Insufficient oxidation time, however, yields a thinner oxide layer that is prone to compositional changes during service due to oxidation of the underlying chromium.

Experiments were performed according to the method of the present invention with wire belts 34 made from Haynes Alloy 214® and a muffle 31 of the apparatus of FIG. 1, having approximately a 0.8 micron thick Al$_2$O$_3$ layer formed thereon by the method of the invention shown in FIG. 3 and described above. Haynes Alloy 214® is a known nickel based metal alloy supplied by Haynes International Inc., having a known composition in weight percent of approximately 75% nickel (as balance), 16.0% chromium, 3.0% iron, 4.5% aluminum, a maximum of 0.5% magnesium, 0.2% silicon, 0.01% boron, 0.1% zirconium, and 0.01% yttrium and 0.05% carbon. X-ray photoelectron spectroscopy (XPS) examination detected less than one atomic percent of Cr, Ni or Fe throughout the thickness of the oxide layer. A silicon wafer was placed on the belt 34, through the muffle 31 to the deposition reaction area 33 where a silicon dioxide film was deposited on the surface of the wafer in a conventional CVD process at 550° C. The wafer was elevated 0.5 mm above the belt by a spacer ring to allow only vapor-phase contamination to reach the wafer.

The belt side surface of wafers (i.e. the surface of the wafer facing the belt) were analyzed for metal contamination content. Chromium metal contamination on the surface was measured using a hydrofluoric acid vapor phase decomposition with graphite-furnace atomic absorption spectrometry (HFVPD/GFAAS) and TXRF techniques known in the art. Results show a metal contamination of 1–3×10$^{10}$Cr atoms/cm$^2$ on the surface of the wafer, a very desirable value.

Figure 4:
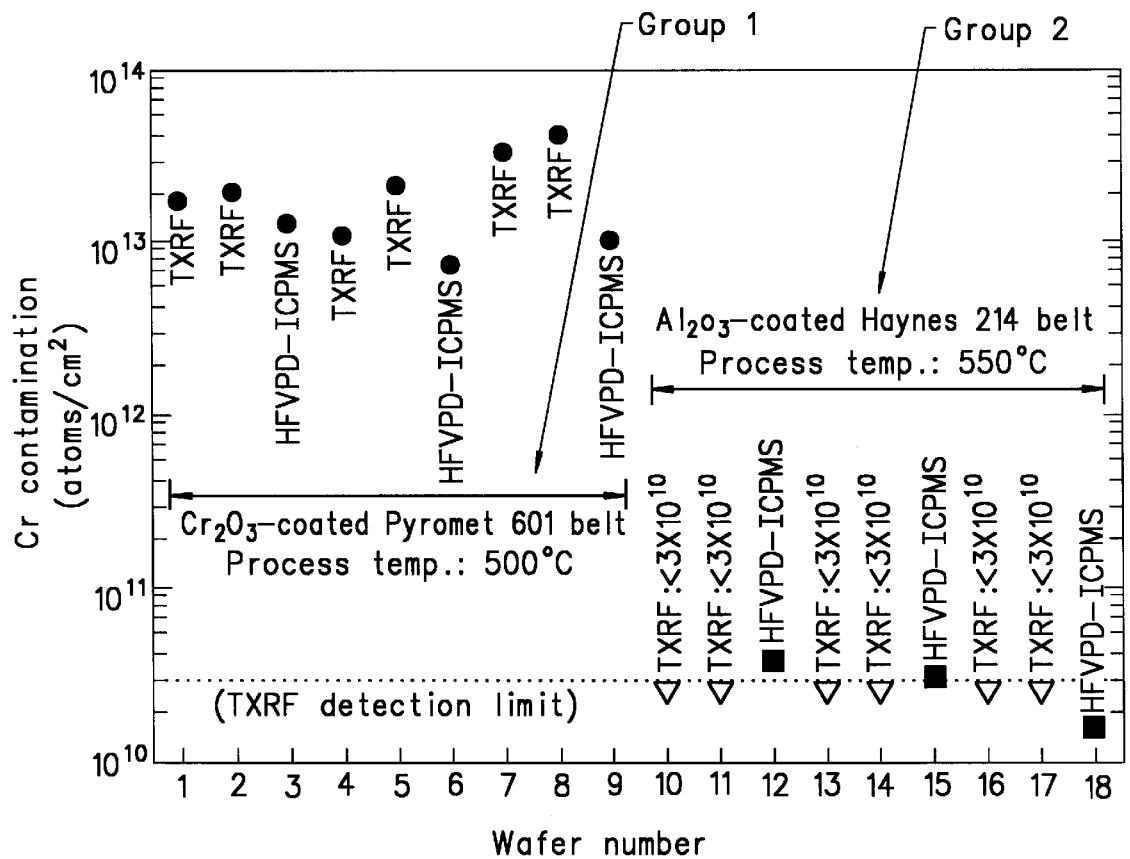
FIG. 4 is a comparison of Cr metal contamination on the surface of wafers, showing Group 1 wafers processed in a conventional method and Group 2 wafers processed in accordance with the present invention.

As a comparison, wafers were run in an identical CVD reactor as shown in FIG. 1, but this time the belt 34 was not treated according to the present invention. That is, the belt 34 did not contain an Al$_2$O$_3$ oxide layer. Instead the belt 34 was comprised of Pyromet 601 metal alloy with a naturally occurring Cr$_2$O$_3$ oxide layer thereon. Silicon wafers were processed to deposit a silicon dioxide film on the surface of the wafers in a conventional CVD process at 500° C. Chromium metal contamination on the belt side surface of the elevated wafers was measured using HFVPD/GFAAS and TXRF techniques. The results are shown in FIG. 4. Group 1 represents Cr metal contamination results for wafers run with the Cr$_2$O$_3$ oxide layer containing belt. Group 2 represents chromium metal contamination results for wafer processed in accordance with the present invention. As shown, chromium metal contamination is reduced by approximately three orders of magnitude by the method of the present invention.

The foregoing description of specific embodiments of the invention have been presented for the purpose of illustration and description. They are not intended to be exhaustive or to limit the invention to the precise forms disclosed, and obviously many modifications, embodiments, and variations are possible in light of the above teaching. It is intended that the scope of the invention be defined by the claims appended hereto and their equivalents.

What is claimed:

1. A method of forming an aluminum oxide layer on the surface of a metal alloy containing Aluminum comprising the steps of heating said metal alloy in a dry $N_2$ atmosphere to a first temperature;

heating said metal alloy in a dry $H_2$ atmosphere to a second temperature;

first soaking said metal alloy at the second temperature in a wet $H_2$ atmosphere having a dewpoint of approximately −40° C. to −20° C. to form an Aluminum oxide layer on the surface of said metal;

second soaking said metal alloy at the second temperature in a dry $H_2$ atmosphere to reduce any oxide layer formed other than said Aluminum oxide layer; and cooling said metal alloy first in dry $H_2$ atmosphere to approximately at least 400° C., and then in a dry $N_2$ atmosphere to room temperature, wherein a layer of substantially pure Aluminum oxide is formed on the surface of said metal alloy.

2. The method of claim 1 wherein said first temperature is in a range of approximately 300° C. to 500° C.

3. The method of claim 1 wherein said second temperature is in a range of approximately 900° C. to 1200° C.

4. The method of claim 1 further comprising the step of soaking said metal alloy in a wet H2 atmosphere having a dewpoint in the range of approximately −10° C. to 25° C. prior to said step of first soaking to form a thin Cr oxide layer on the surface of said metal.

5. The method of claim 1 wherein said Aluminum oxide layer has a thickness in the range of approximately 0.6 to 1.0 microns.

6. The method of claim 1 wherein said Aluminum oxide layer has a thickness in the range of approximately 0.6 to 1.0 microns.

7. The method of claim 1 wherein the step of first soaking is performed for approximately 1 to 8 hours.

8. The method of claim 1 wherein the step of second soaking is performed for approximately 1 to 2 hours.

9. The method of claim 4 wherein the step of soaking said metal alloy in a wet $H_2$ atmosphere having a dewpoint in the range of approximately −10° C. to 25° C. is performed for approximately 30 minutes to 3 hours.

10. A method of forming an aluminum oxide layer on the surface of a metal alloy containing aluminum, comprising the steps of:

heating said metal alloy to an elevated temperature in an atmosphere of hydrogen having a dewpoint which permits the oxidation of any chromium to form chromium oxide;

heating the oxidized metal alloy in an atmosphere of hydrogen having a dew point selected to prevent the further oxidation of any chromium present in the alloy and water vapor for oxidizing the aluminum to form an aluminum oxide layer; and thereafter heating the oxidized metal alloy in an atmosphere of hydrogen having a dewpoint whereby the chromium oxide acts as an oxygen source for growing an aluminum oxide leaving a pure aluminum oxide layer.

11. A method of depositing a film on the surface of a substrate during processing in a CVD system including a metal conveyor belt and a CVD reactor, comprising the steps of:

forming an Aluminum oxide layer on the surface of said metal conveyor belt to substantially minimize Cr volatile metal atoms from forming from said metal conveyor belt;

introducing a plurality of reactive gases into said CVD reactor; and reacting said reactive gases in said CVD reactor to deposit a film substantially free of volatile metal atoms on the surface of said substrate.

12. The method of claim 11 wherein the film has a metal atom concentration of substantially $1-3\times10^{10}$Cr atoms/cm$^2$.

13. The method of claim 11 wherein said CVD reactor further comprises: at least one CVD chamber area within said muffle, and at least one injector for conveying gases into said at least one CVD chamber area as said conveyor belt moves the substrate through the muffle.

14. The method of claim 11 wherein said CVD system is an atmospheric pressure CVD system.

15. The method of claim 11 wherein said CVD system is a low pressure CVD system.

16. The method of claim 11 wherein said CVD system is a plasma enhanced CVD system.

17. The method of claim 11 wherein said Aluminum oxide layer has a thickness of approximately 0.6 to 1.0 microns.

18. The method of claim 11 wherein said conveyor belt is comprised of a metal alloy containing approximately 3 to 5 weight percent Aluminum.

19. The method of claim 11 wherein said conveyor belt is comprised of Haynes Alloy 214® nickel based alloy having a composition in weight percent of approximately 75% nickel, 16.0% chromium, 3.0% iron, 4.5% aluminum, a maximum of 0.5% magnesium, 0.2% silicon, 0.01% boron, 0.1% zirconium, and 0.01% yttrium and 0.05% carbon.

20. The method of claim 11 wherein the step of forming further comprises:

heating said conveyor belt in a dry $N_2$ atmosphere to a first temperature;

heating said conveyor belt in a dry $H_2$ atmosphere to a second temperature;

first soaking said conveyor belt at the second temperature in a wet $H_2$ atmosphere having a dewpoint of approximately −40° C. to −20° C. to form an Aluminum oxide layer on the surface of said metal;

second soaking said conveyor belt at the second temperature in a dry $H_2$ atmosphere to reduce any oxide layer formed other than said Aluminum oxide layer; and cooling said conveyor belt first in dry $H_2$ atmosphere to approximately at least 400° C. and then in a dry $N_2$ atmosphere to room temperature, wherein a layer of substantially pure Aluminum oxide is formed on the surface of said conveyor belt.

21. A method of reducing metal contamination on the surfaces of a substrate and in a film formed on said substrate during processing in a reactor having metal components, where an Aluminum oxide layer is formed on the surface of at least one of said metal components, and said substrate is processed in said reactor to form a film on one of the surfaces of said substrate, wherein the Aluminum oxide layer substantially prevents the formation of volatile metal atoms from said metal components thereby minimizing metal atom contamination from accumulating on the surfaces of said substrate and in said film.

22. The method of claim 21 wherein the film has a metal atom concentration of substantially $1-3\times10^{10}$Cr atoms/cm$^2$.

23. The method of claim 21 wherein said reactor further comprises:

at least one CVD chamber having a conveyor belt, and at least one injector for conveying gases into the CVD chamber.

24. The method of claim 21 wherein said aluminum oxide layer has a thickness of approximately 0.6 to 1.0 microns.

25. The method of claim 21 wherein at least one of said metal components are comprised of a metal alloy containing approximately 3 to 5 weight percent aluminum.

26. The method of claim 21 wherein the aluminum oxide layer is formed by:

heating said metal components in a dry $N_2$ atmosphere to a first temperature;

heating said metal components in a dry $H_2$ atmosphere to a second temperature;

first soaking said metal components at the second temperature in a wet $H_2$ atmosphere having a dewpoint of approximately −40° C. to −20° C. to form an Aluminum oxide layer on the surface of said meta;

second soaking said metal components at the second temperature in a dry $H_2$ atmosphere to reduce any oxide layer formed other than said Aluminum oxide layer; and cooling said metal components first in dry $H_2$ atmosphere to approximately at least 400° C., and then in a dry $N_2$ atmosphere to room temperature, wherein a layer of substantially pure aluminum oxide is formed on the surface of said metal components.

27. A method of forming an aluminum oxide layer on the surface of a metal alloy containing Aluminum comprising the steps of.

heating said metal alloy in a dry $N_2$ atmosphere to a first temperature;

heating said metal alloy in a dry $H_2$ atmosphere to a second temperature;

first soaking said metal alloy at the second temperature in a wet $H_2$ atmosphere having a dewpoint of approximately −10° C. to 25° C. to temporarily form a Cr oxide layer on the surface of said metal;

second soaking said metal alloy at the second temperature in a wet $H_2$ atmosphere having a dewpoint of approximately −40° C. to −20° C. to form an Aluminum oxide layer on the surface of said metal;

third soaking said metal alloy at the second temperature in a dry $H_2$ atmosphere to reduce any oxide layer formed other than said Aluminum oxide layer; and cooling said metal alloy first in dry $H_2$ atmosphere to approximately at least 400° C. and then in a dry $N_2$ atmosphere to room temperature, wherein a layer of substantially pure Aluminum oxide is formed on the surface of said metal alloy.

28. The method of claim 27 wherein said first temperature is in a range of approximately 300° C. to 500° C.

29. The method of claim 27 wherein said second temperature is in a range of approximately 900° C. to 1200° C.

30. The method of claim 27 wherein said Aluminum oxide layer has a thickness of approximately 0.6 to 1.0 microns.

31. The method of claim 27 wherein said Aluminum oxide layer has a thickness in the range of 0.6 to 1.0 microns.

32. The method of claim 27 wherein the step of first soaking is performed for approximately 30 minutes to 3 hours.

33. The method of claim 27 wherein the step of second soaking is performed for approximately 1 to 8 hours.

34. The method of claim 27 wherein the step of third soaking is performed for approximately 1 to 2 hours.

* * * * *